United States Patent

[11] 3,579,133

[72] Inventor Jack R. Harford
Three Bridges, N.J.
[21] Appl. No. 794,973
[22] Filed Jan. 29, 1969
[45] Patented May 18, 1971
[73] Assignee RCA Corporation

[54] SIGNAL TRANSLATING STAGE
9 Claims, 1 Drawing Fig.

[52] U.S. Cl. .......... 330/19, 330/29, 330/32
[51] Int. Cl. .......... H03f 3/42, H03g 3/30
[50] Field of Search .......... 330/18, 19, 29, 32, 38, 38M

[56] References Cited
UNITED STATES PATENTS

| | | | |
|---|---|---|---|
| 3,210,683 | 10/1965 | Day .......... | 330/29X |
| 3,430,154 | 2/1969 | Harwood .......... | 330/38X |
| 3,502,997 | 3/1970 | Narud et al. .......... | 330/18X |

*Primary Examiner*—Roy Lake
*Assistant Examiner*—Lawrence J. Dahl
*Attorney*—Eugene M. Whitacre

ABSTRACT: A signal translating stage especially suited for fabrication using integrated circuit techniques including a first transistor, the transconductance of which is adjusted to effect a desired attenuation of applied input signals in response to a controllable direct voltage applied to an included second transistor, with the control voltage being applied in a manner to introduce a minimum of distortion in the attenuated signal over a wide control range.

Patented May 18, 1971 3,579,133
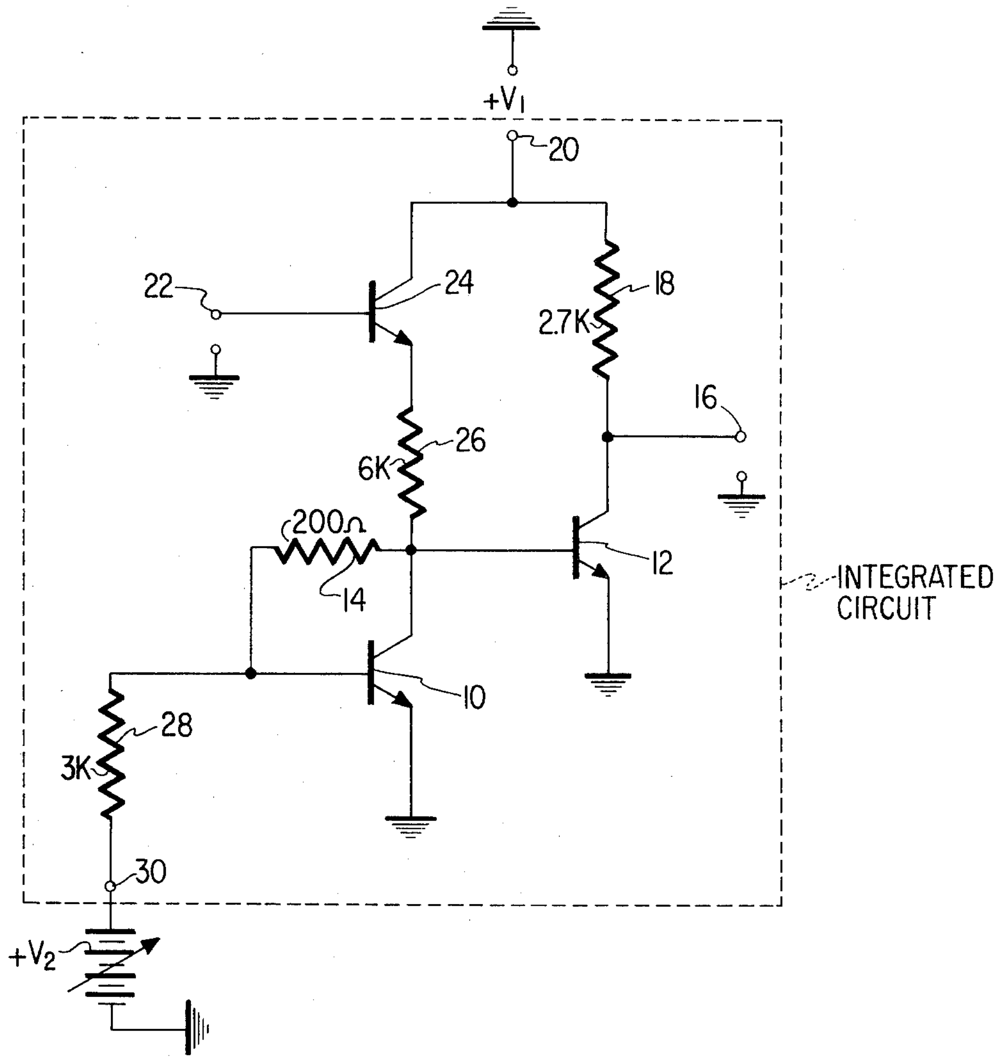
INVENTOR
Jack R. Harford
BY Eugene M. Whitacre
ATTORNEY

SIGNAL TRANSLATING STAGE

SIGNAL TRANSLATING STAGE

The present invention relates to a signal translating stage and, more particularly, to a transistor attenuator circuit capable of operating over a wide control range while introducing a minimum of signal distortion.

As will become clear hereinafter, such a circuit includes a pair of transistors, with the DC collector electrode current through the first being varied by means of a DC control voltage applied to the base electrode of the second. Input signals to be attenuated are coupled to the base electrode of the first transistor, and are gain reduced according to the changes in the transconductance of the first transistor associated with its DC collector electrode current variations. The coupling of the input signals to the first transistor is controlled by the second transistor, with the control being accomplished in a manner to compensate any tendency to produce distortion in the output signals from the first transistor, as a result of changes in its transconductance caused by the applied input signals.

By employing two transistors of the same type classification and having closely matched characteristic, very little distortion will be introduced as the amount of signal attenuation is increased. The attenuator circuit, therefore, is especially attractive for incorporation as part of a monolithic integrated circuit chip, where the two transistors will be substantially identical. In such an environment, the supplied input signals may well have an amplitude of the order of a few volts peak-to-peak.

As will also become clear, the present invention is especially suited for such fabrication in that the attenuator includes in a preferred embodiment only four practically realizable resistive components, in addition to the two specified transistors. Significantly reduced complexity over known attenuator circuits of comparable signal handling capabilities (e.g. those employing "current steered" techniques in emitter coupled amplifier configurations) is yet another advantage of the invention.

For a better understanding of the signal translating stage of the present invention, reference is had to the following description taken in connection with the single FIGURE of the drawing showing one of its embodiments, and its scope will be pointed out in the appended claims.

Referring to the drawing, the signal translating stage there shown includes a pair of transistors 10 and 12 having their respective emitter electrodes connected to a point of reference or ground potential. A first resistor 14 is connected between the base and collector electrodes of the transistor 10, with the latter collector electrode being additionally direct coupled to the base electrode of the transistor 12. The collector electrode of the transistor 12 is, in turn, coupled first to a signal output terminal 16 and, second, by way of a load resistor 18 to a terminal 20 adapted to be connected to a source of energizing potential $V_1$.

Signals to be attenuated by the circuit are applied through an input terminal 22 to the base electrode of a third transistor 24. The collector electrode of the transistor 24 is also connected to the energizing potential terminal 20, while the emitter electrode of that transistor is coupled by a resistor 26 to the collector electrode of the transistor 10.

A bias resistor 28 is further included in the circuit, and connects the base electrode of the transistor 10 to an attenuator control terminal 30. A source of controllable DC voltage $V_2$ is shown connected to the terminal 30 and serves to vary the bias on the transistor 10. As will become apparent below, this variation serves to effect the attenuation of signals applied to the input transistor 24 and translated by means of that transistor 24 and the resistor 26 to the output transistor 12.

In a preferred embodiment of the invention, signal input terminal 22 is connected to the output of a limiter stage of an angle modulated wave processing channel for a television receiver supplying frequency modulated waves having a frequency of 4.5 MHz. These waves may typically have a peak-to-peak amplitude of a few volts or so, on a DC reference level of 3.5 volts relative to ground. Output terminal 16 is, in turn, connected to the detector stage of the processing channel—example, a frequency modulation detector of the type disclosed in pending Application Ser. No. 705,709, filed Feb. 15, 1968.

In operation, assume first that transistors 10 and 12 are of the same type classification and are closely matched in transistor characteristic. Assume also that the resistance value of resistor 14 is approximately one-tenth as large as the dynamic impedance of transistor 10 at its base electrode, and is of a similarly proportionate fraction of the resistance value of the resistor 28.

With these value relationships established and with the potential source $V_2$ providing a DC potential of zero volts at control terminal 30, it will be seen that substantially all the DC current flowing through transistor 24 and resistor 26 will flow through the transistor 10. That current which does not flow through the transistor 10 will flow instead through the resistor 14, but will be of an amount to provide only a very small DC voltage drop across that resistor.

The DC current flowing through resistor 26 will, under these circumstances, substantially equal the DC current flowing through transistor 12 and its load resistor 18. This follows because the base-emitter junctions of the two transistors 10 and 12 will essentially be connected in parallel and because the two transistors have been selected of the same type classification.

Assume now that the voltage source $V_2$ is adjusted to provide a positive DC voltage at the control terminal 30. This DC voltage causes a corresponding current flow through the resistors 28 and 14, and in a direction to increase the conductivity of the transistor 10. With this increased conductivity, the DC collector electrode potential of transistor 10 decreases, as does the DC potential applied to the base electrode of the transistor 12. A reduction in the amount of DC current flowing through the transistor 12 results, causing the transconductance of the transistor 12 to decrease as well. Since the voltage gain provided by the grounded emitter transistor stage 12 is directly proportional to its transconductance, a corresponding decrease results in the amplitude of signals developed at the collector electrode of transistor 12 and at the terminal 16. It is in this manner that the desired attenuation of applied input signals is effected.

As will be appreciated, the defining equation for the DC voltage across the base-emitter junction diode of the transistor 12 is given by the general expression:

$$V_{be}=\frac{kT}{q}\ln\frac{I_e}{I_s}+I_e r_{ec}+\frac{I_e r_b'}{\beta+1} \qquad (1)$$

where $k$ = Boltzmann's constant, T = the absolute temperature in degrees Kelvin, $q$ = the charge on an electron, $I_e$ = the emitter current of the transistor 12 and $I_s$ = the saturation current of the transistor. Also, $r_{ec}$ = the emitter and contact lead resistance of the transistor 12, while $r_b'$ = its base input resistance and $\beta$ = its forward current gain.

Neglecting for a moment the effects of the last two terms of equation (1) and appreciating that the expression $$\frac{kT}{q}=26$$

millivolts at room temperature, it can be shown that a decrease in $V_{be}$ of approximately 18 millivolts DC corresponds to a reduction of one-half the emitter current of the transistor.

A decrease in the DC collector potential of the transistor 10 of the drawing, therefore, will cause a one-half reduction in the DC collector current of transistor 12 when the collector potential decrease is of this 18 millivolt value. A corresponding reduction of transconductance will result, with a corresponding lessening of signal gain by a factor of one-half. And, for every 18 millivolt DC decrease there will be, the gain will be reduced by 6 db. This decrease of 18 millivolts, or of a greater or lesser amount, is accomplished through the joint action of resistors 14 and 28 with the voltage source $V_2$.

It will also be appreciated that where the signal supplied to input terminal 22 has the previously mentioned 3.5 volt or so DC component, this 18 millivolt potential decrease at the collector electrode of transistor 10 requires only a very small change in current flowing through the transistor 10 when resistor 26 has a resistance value in the order of a few kilohms. Since the current flowing through resistor 26 is not required to change very much in order to effect this DC potential change, the transistor 10 operates essentially as a linear voltage translator. With the values shown in the drawing, the 18 millivolt DC change can be accomplished by increasing the voltage at the base electrode of transistor 10 by approximately 1 or 2 millivolts, so that transistor 10 more particularly comprises a linear voltage amplifier.

In operation, the circuit of the drawing provides a relationship which is essentially linear-logarithmic. Such a relationship is a very desirable one in audio frequency applications where DC control is desired. By properly selecting relative values for the resistors 14 and 28, a 1 volt DC change of the source $V_2$, for example, can be made to produce a 6 db. change in the amplitude of an output signal derived at the terminal 16.

As was previously mentioned, the arrangement of the drawing is especially suited for integrated circuit fabrication, since all of the components (except for the voltage sources) are fabricable using present day techniques. In such configurations, the value of the elements $r_{ec}$ and $r_b'$ of the above-defined equation are dependent upon the physical geometry of the integrated structure. Where the integrated structure of the invention was small—as, for example, where the described circuit comprised but a part of an overall angle modulated wave processing channel of 50 mils × 50 mils construction, and where the dimensions of the transistor 12 were 3.5 mils × 5.5 mils–the values for these two elements were determined to be 3 ohms and 40 ohms, respectively. The value of $\beta$ in these constructions approximated 50.

Where the current through the transistor 12 was initially established at a 1 milliamp DC value, the latter two terms of expression (1) can be shown to add a factor of 3.8 millivolts to the base-emitter junction voltage of transistor 12. When the collector current in transistor 12 is decreased to effect the attenuation, the existence of these latter elements have been found to add a distortion component to the output signal, which in some cases may be undesirable. Such is not the case in the preferred angle modulated wave environment, however, because this type of undesired amplitude modulation is rejected by the following frequency modulation detector.

Where the circuit of the drawing is employed as an audio preamplifier stage, on the other hand, this distortion may create serious difficulties. In order to reduce the problems that may be presented, the amount of current flowing through transistors 10 and 12 can be reduced–to decrease the latter terms of the expression (1). Alternatively, the circuit can be constructed to be of a larger physical geometry, to thereby decrease the values of $r_{ec}$ and $r_b'$, while keeping the value of $\beta$ high.

It should also be noted that this distortion is inherently reduced by the described circuit in yet another manner. That is, as the amplitude of the AC signal developed at the emitter electrode of transistor 24 is varied, the portion of the signal coupled through resistor 14 to the base electrode of the transistor 10 varies in the same manner. The collector current of transistor 10 changes also, and in the same direction as the signal variation, with the result being that the dynamic impedance at the collector electrode of transistor 10 changes in the opposite direction. Since transistor 24 and resistor 26 essentially comprise a constant current source, the signal at the collector electrode of transistor 10 thus varies in a manner opposite to that of the transistor 24 developed signals, and serves to introduce a predistortion component in the signals coupled to transistor 12. This component, however, is in a direction to oppose the distortion components introduced by the transistor 12 itself, caused by the modulation of its transconductance due to the applied signals. The resulting effect has been observed to be the introduction of only a 2 percent distortion into the attenuated signal of the illustrated circuit with a control range approximating 40 db. of attenuation. By reducing the $r_{ec}$ and $r_b'$ terms, furthermore, the distortion has been reduced still further, to only a few tenths of a percent.

Further reductions in distortion may also be had by decreasing the resistance value of resistor 14 relative to that of resistor 28 and to the input impedance of transistor 10.

This described attenuator is, therefore, exceedingly simple to construct, yet does not sacrifice anything in the way of performance. The circuit has been employed successfully as a radio frequency attenuator in the above-described angle modulated wave processing channel, but is also particularly attractive for remote control applications where a DC gain control having a linear-logarithmic relationship is desirable.

Another attractive feature of the circuit is that, with no DC control voltages applied to the terminal 30, the arrangement can provide signal amplification instead of signal attenuation. This follows from the fact that signals developed at output terminal 16 can swing the entire value of the energizing potential source $V_1$. Thus, an input signal having an amplitude of 1 or 2 volts, for example, can produce output signals at terminal 16 having a peak-to-peak amplitude of 5 volts or so, where the source $V_1$ is of that value.

I claim:

1. A signal translating stage comprising:

a pair of semiconductor amplifier devices, each having first, second and third electrodes;

input circuit means coupled to the third electrode of one of said devices for supplying signals to be translated by said stage;

output circuit means coupled to the third electrode of the other of said devices for deriving translated signals corresponding to said supplied signals;

means for direct current coupling said third electrode of said one device to said second electrode of said other device means, including a direct current impedance, for coupling said second electrode of said one device to said second electrode of said other device and for coupling said first electrodes of said devices in common; and control means coupled to the second electrode of said one of said devices for supplying direct current voltages thereto to vary the transconductance of said other device without substantial variation of transconductance of said one device and thereby vary the amplitude of said derived translated signals.

2. A signal translating stage as defined in claim 1 wherein said semiconductor amplifier devices comprise a pair of transistors disposed in a single integrated circuit, and wherein said first, second and third electrodes correspond to the emitter, base and collector electrodes of said transistors, respectively.

3. A signal translating stage as defined in claim 2 wherein said input circuit means includes a first resistor coupling a source of signals to be translated to the collector electrode of said one semiconductor amplifier transistor device and wherein said output circuit means includes a second resistor coupling a source of energizing potential to the collector electrode of said other semiconductor amplifier transistor device.

4. A signal translating stage as defined in claim 3 wherein said means including a direct impedance includes direct current connections between the emitter electrodes of said semiconductor amplifier transistor devices, a direct current connection between the collector electrode of said one and the base electrode of said other semiconductor amplifier device, and a third resistor connected between the collector and base electrodes of said one semiconductor amplifier transistor device.

5. A signal translating stage as defined in claim 4 wherein said control means includes a source of controllable direct current voltage and a fourth resistor connecting the base electrode of said one semiconductor amplifier transistor device to said direct current voltage source.

6. A signal translating stage as defined in claim 5 wherein the resistance value of said fourth resistor is substantially greater than the resistance value of said third resistor and wherein the input impedance at the base electrode of said one semiconductor amplifier transistor device exceeds the resistance value of said third resistor.

7. A signal translating stage as defined in claim 1 wherein:
said direct current impedance comprises a first resistor having a resistance value less than the input impedance at the second electrode of said one device.

8. A signal translating stage as defined in claim 7 wherein:
said control means comprises a source of direct voltage and a second resistor coupled to said second electrode of said one device, and
the resistance value of said first resistor is substantially less than the resistance values of said second resistor and said input impedance.

9. A signal translating stage comprising:
first, second and third terminals;
first, second and third transistors, each having emitter, base and collector electrodes;
first and second direct connections from the emitter electrodes of said first and second transistors to said first terminal;
a direct connection from the collector electrode of said third transistor to said second terminal;
a direct connection from the collector electrode of said first transistor to the base electrode of said second transistor;
a first resistor connected between the collector electrode of said first transistor and the emitter electrode of said third transistor;
a second resistor connected between the collector electrode of said second transistor and said second terminal;
a third resistor connected between the collector and base electrodes of said first transistor;
a fourth resistor connected between the base electrode of said first transistor and said third terminal;
input circuit means coupled to the base electrode of said third transistor for supplying signals to be translated by said stage;
output circuit means coupled to the collector electrode of said second transistor for deriving translated signals corresponding to said supplied signals; and
control means coupled to said third terminal for supplying controllable direct current voltages to vary the bias on said first transistor to control the amplitude of said derived translated signals.